(12) United States Patent
Hayashi

(10) Patent No.: US 8,440,478 B2
(45) Date of Patent: May 14, 2013

(54) LIGHT EMITTING DEVICE, PACKAGE, LIGHT EMITTING DEVICE MANUFACTURING METHOD, PACKAGE MANUFACTURING METHOD AND PACKAGE MANUFACTURING DIE

(75) Inventor: Masaki Hayashi, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 13/488,560

(22) Filed: Jun. 5, 2012

(65) Prior Publication Data
US 2012/0295374 A1 Nov. 22, 2012

Related U.S. Application Data

(62) Division of application No. 12/309,024, filed as application No. PCT/JP2007/074031 on Dec. 13, 2007, now Pat. No. 8,217,414.

(30) Foreign Application Priority Data

Dec. 28, 2006 (JP) ................................. 2006-356629

(51) Int. Cl.
*H01L 33/52* (2010.01)
*H01L 23/495* (2006.01)
*B29C 45/00* (2006.01)
*B29C 45/14* (2006.01)

(52) U.S. Cl.
USPC ............. 438/26; 438/116; 438/124; 438/126; 438/127; 257/680; 257/676; 257/790; 257/793

(58) Field of Classification Search .................... 438/26, 438/123; 257/99, 690, E21.499
See application file for complete search history.

(56) References Cited

U.S. PATENT DOCUMENTS 6,091,139 A * 7/2000 Adachi et al. ................. 257/690
6,943,433 B2 9/2005 Kamada
(Continued)

FOREIGN PATENT DOCUMENTS

JP 02069215 A 3/1990
JP 11-045958 2/1999
(Continued)

OTHER PUBLICATIONS

International Search Report corresponding to International Patent Application No. PCT/JP2007/074031 dated Mar. 25, 2008.
(Continued)

*Primary Examiner* — Olik Chaudhuri
*Assistant Examiner* — Wilner Jean Baptiste
(74) *Attorney, Agent, or Firm* — Squire Sanders (US) LLP

(57) ABSTRACT

A light emitting device includes a resin molded body having a circular or an oval recessed section at the center suppresses generation of cracks. The device is provided with a light emitting element, a first resin molded body having a plurality of outer surfaces, and a recessed section at the center. First and second leads are electrically connected to the light emitting element, and a second resin molded body is applied in the recessed section. The light emitting element is placed on the first lead, and the surface of the second resin molded resin forms a light emitting surface. A gate notch is formed on an extended line of a normal line on one point on a circular cross-section of the recessed section in the normal line direction.

4 Claims, 6 Drawing Sheets

U.S. PATENT DOCUMENTS

| | | |
|---|---|---|
| 7,148,529 B2 | 12/2006 | Oida et al. |
| 7,429,757 B2 | 9/2008 | Oyama et al. |
| 7,465,959 B2 | 12/2008 | Sugawara |
| 2003/0132701 A1 | 7/2003 | Sato et al. |
| 2007/0120139 A1 | 5/2007 | Ono |
| 2010/0104794 A1 | 4/2010 | Aoki et al. |

FOREIGN PATENT DOCUMENTS

| | | |
|---|---|---|
| JP | 2001-24228 | 1/2001 |
| JP | 2001-177160 | 6/2001 |
| JP | 2003-340889 A | 12/2003 |
| JP | 2005-259972 | 9/2005 |
| JP | 2005-294736 | 10/2005 |
| JP | 2006-140207 | 6/2006 |
| JP | 2006-156704 | 6/2006 |
| JP | 2006-224369 A | 8/2006 |
| JP | 2007-116074 | 5/2007 |

OTHER PUBLICATIONS

Supplementary European Search Report Issued Apr. 7, 2011 in corresponding European Patent Application No. 07850551.8.

* cited by examiner

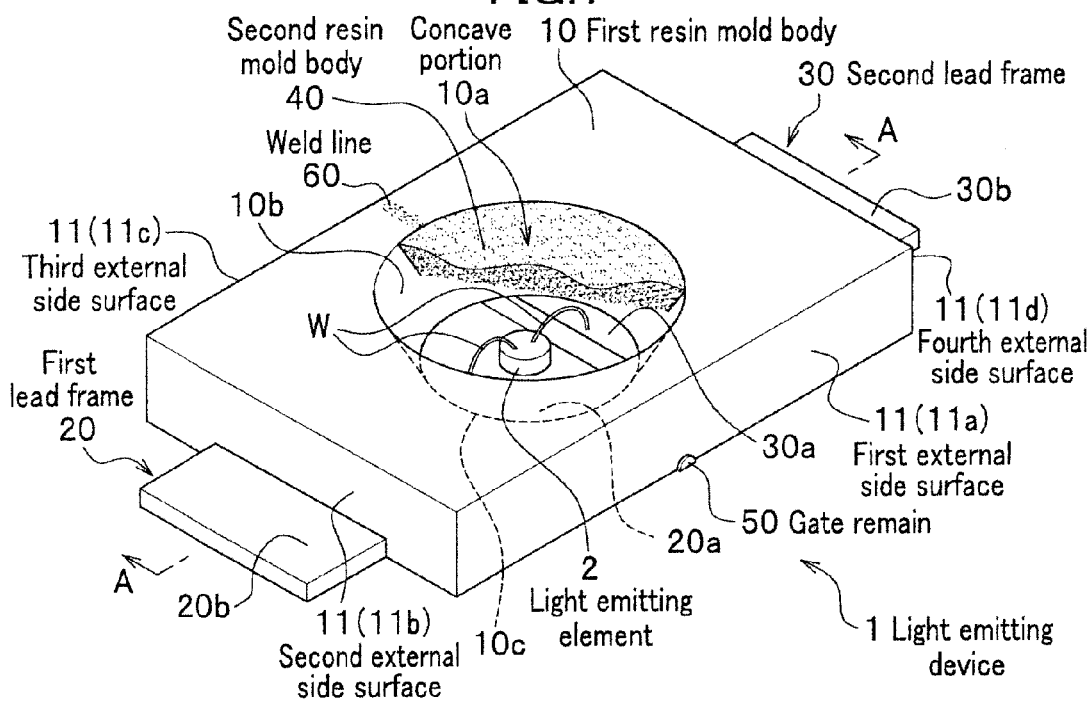
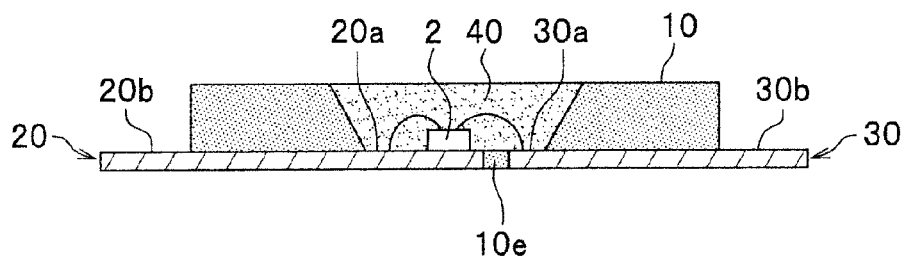
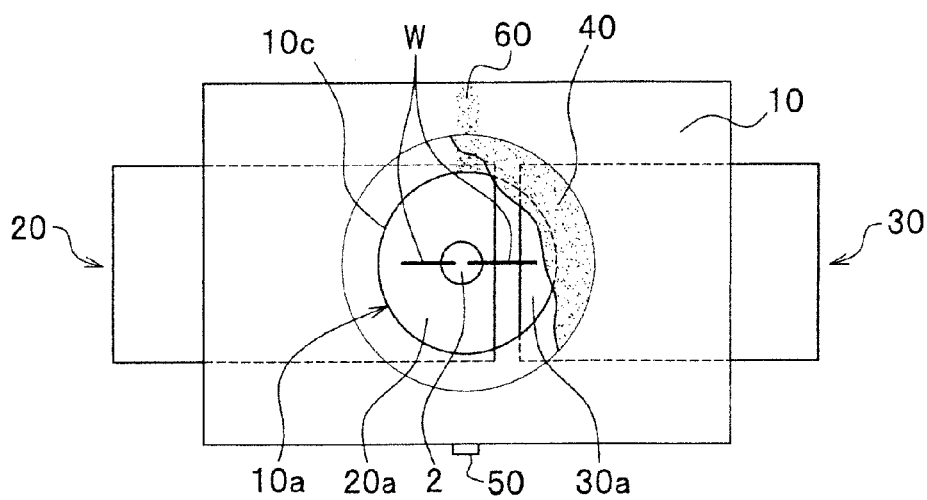

LIGHT EMITTING DEVICE, PACKAGE, LIGHT EMITTING DEVICE MANUFACTURING METHOD, PACKAGE MANUFACTURING METHOD AND PACKAGE MANUFACTURING DIE

REFERENCE TO RELATED APPLICATIONS

This is a Division of application Ser. No. 12/309,024 filed Jan. 9, 2009 which is a 371 of International Application No. PCT/JP2007/074031 filed Dec. 13, 2007 which claims priority from Japanese Patent Application No. 2006-356629 filed Dec. 28, 2006. The disclosure of the prior application(s) is hereby incorporated by reference herein in its entirety.

TECHNICAL FIELD

The present invention relates to a light emitting device to be used for, for example, lighting apparatuses, displays, a backlight of cellular phone, an auxiliary light source for animation illumination, and other general consumer light sources, a package suitable for the light emitting device, a manufacturing method of the light emitting device, a manufacturing method of the package, and a package manufacturing die.

BACKGROUND ART

Generally, it is well known that a light emitting device using a light emitting element is compact and excellent in power efficiency and emits bright colors. The light emitting element used for the light emitting device is a semiconductor device. Therefore, the light emitting element is excellent in an initial drive performance in addition to almost free from blowout, and resistant to vibrations and repetitions of ON/OFF switching. Since the light emitting element has excellent characteristics as described above, a light emitting device using the light emitting element such as a light emitting diode (LED) and a laser diode (LD) is used for various kinds of light sources.

Patent literature 1: Japanese Patent Laid-open Publication No. 2005-259972
Patent literature 2: Japanese Patent Laid-open Publication No. 2001-177160
Patent literature 3: Japanese Patent Laid-open Publication No. H11-45958
Patent literature 4: Japanese Patent Laid-open Publication No. 2006-156704
Patent literature 5: Japanese Patent Laid-open Publication No. 2005-294736

Here, FIG. 10 is a side cross sectional view showing a conventional light emitting device 100 according to the Japanese Patent Laid-open Publication No. 2005-259972 or the Japanese Patent Laid-open Publication No. 2001-177160.

The conventional light emitting device 100 shown in FIG. 10 includes a light emitting element 101, a mounting lead frame 102 for mounting the light emitting element 101, a wiring lead frame 103 to be connected to the light emitting element 101 through a lead wire, and a resin mold body 104 covering a most part of each lead frame. The resin mold body 104 has, for example, a rectangular outer shape in plan view, and is provided with a concave portion 105 having a circular truncated cone shape which becomes narrower toward downward at approximately the center of the resin mold body 104. The mounting lead frame 102 is set on a bottom surface of the concave portion 105, and the light emitting element 101 is placed on an upper surface of the mounting lead frame 102. In addition, a resin 108 is disposed in the concave portion 105 as a light emitting portion.

As described above, since the light emitting portion is formed by filling the resin 108 in the concave portion 105 which is opened upward, a light emitted from the light emitting element 101 is uniformly reflected by the bottom surface and side surface of the concave portion 105. As a result, the light can be output from a light emitting surface side, on which the light emitting element 101 is placed, without polarizing.

Generally, the resin mold body 104 of the light emitting device 100 described above is integrally formed with the lead frames 102, 103. Here, FIG. 11 is a side cross sectional view showing a molding method of a conventional resin mold body (see Japanese Patent Laid-open Publication No. H11-45958).

A method for molding the resin mold body 104 is as follows. As shown in FIG. 11, the lead frames 102, 103 are set between an upper die 111 and a lower die 112, and a thermoplastic resin is injected and filled into a space 114 formed by the upper die 111 and the lower die 112 from an injection port 115. Then, the filled thermoplastic resin is cured to form the resin mold body 104 (hereinafter, this molding method is referred to as "molding method 1").

The molding method 1 is characterized in that, by injecting a thermoplastic resin from the bottom center of the lower die 112, the resin is radially diffused, and thereby the resin is uniformly filled in every corner of the space 114. It is noted that a protruding portion 117 corresponding to the concave portion 105 is formed in the upper die 111.

However, there have been the following problems in the molding method 1. That is, in the molding method 1, since the injection port 115 is disposed at the bottom center of the resin mold body 104, a gate remain 106 is formed at the bottom center of the resin mold body 104 as shown in FIG. 10. The gate remain is a protrusion remaining on a resin mold body when the dies are opened and the resin mold body (gate), which is formed at the injection port portion when a thermoplastic resin is injected from the injection port, is cut off from the gate portion. If the gate remain 106 is formed at the bottom center of the resin mold body 104 as described above, this causes a problem (1) that a steady reflow bonding can not be ensured due to the cutting remain of the gate remain 106 when the reflow bonding to a wiring substrate 107 is conducted. In addition, if the gate remain 106 is formed at the bottom center of the resin mold body 104, this causes a problem (2) that when the lead frames 102, 103 are bended, the bending work is disturbed since a bending machine is caught in the cutting remain of the gate remain 106.

Further, in the molding method 1, since a thermoplastic resin is used, a fluidity of the resin is low, and as a result, the molding method 1 is inappropriate for molding the resin mold body 104 having a complex shape. In addition, there has been a problem (3) that a thermoplastic resin is poor in heat resistance and adhesiveness to the lead frame.

Therefore, a method for solving the problems described above has been considered, in which an injection port is disposed on an external wall portion 116 (see FIG. 11) of the upper die 111 or lower die 112 and a thermosetting resin is injected from the injection port to mold the resin mold body 104.

For example, an invention is described in the Japanese Patent Laid-open Publication No. 2006-156704 or the Japanese Patent Laid-open Publication No. 2005-294736, in which a thermosetting resin is injected into a space between the upper die and the lower die by a transfer molding. In the molding method described above, there is no specific description on the arrangement of injection port and an injecting direction. However, since a gate is disposed on an external side surface of the resin mold body, for example, by disposing the injection port on the external wall portion (see 116 in FIG. 11) of the upper die, the problem (1) and problem (2) can be solved. In addition, since a thermosetting resin is excellent in fluidity, heat resistance, and adhesiveness to lead frames, the problem (3) can be solved (hereinafter, this molding method is referred to as "conventional method").

DISCLOSURE OF THE INVENTION

Problems to be Solved by the Invention

However, in the conventional method, there has been a problem that a weld line is formed in the resin mold body due to injection of a thermosetting resin from a side of the upper die. The weld line is a buffer layer in an interface portion produced by various kinds of external factors such as a fluidity of resin, a variation of resin viscosity, a time difference between injected resins, and the like when the thermosetting resin is injected into the space.

Here, FIG. 12 is an illustration showing one embodiment of the conventional method, which is a cross section of an upper die in plan view.

As shown in FIG. 12, in the conventional method, for example, an injection port 115' is disposed at a position X of an upper die 111' directed to and perpendicular to a facing wall 118. In this case, an injected thermosetting resin moves to a direction indicated by arrows along an outer periphery of a protruding portion 117 to fill the space in a counterclockwise direction. As a result, it is supposed that a weld line is formed in the vicinity of a position Y.

If the resin mold body is formed as described above, a curing reaction of the first injected thermosetting resin at around the position Y is progressed, while the curing reaction of just injected thermosetting resin is not progressed. In this case, a weld line formed as described above has been especially poor in strength and has caused cracks.

In addition, since a shape of the resin mold body has become complex compared with the conventional light emitting device, a stress-focusing portion is likely to be formed. In addition, due to a secondary work such as cut and forming and deburring, or a thermal history of rapid heating and cooling in the reflow bonding, cracks has been likely to be generated from the weld line which is poor in strength.

Especially, if a resin having a large thermal expansion coefficient such as silicone resin or modified silicone resin is used for a resin 108 shown in FIG. 10, the resin 108 largely expands and contracts in the heating and cooling. Due to the expansion and contraction of the resin 108, a huge stress has been generated in the resin mold body 104 to generate cracks in the weld portion which is poor in strength.

The present invention has been developed for solving the problems described above, and it is, therefore, an object of the present invention to provide a light emitting device, a package, a manufacturing method of the light emitting device, a manufacturing method of the package, and a package manufacturing die, each of which can suppress generation of cracks in a resin mold body having a circular or ellipsoidal concave portion at the center of the resin mold body.

Means for Solving the Problems

Therefore, a light emitting device according to the present invention, which includes: a light emitting element; a first resin mold body having an external side surface, provided with a concave portion having a circular shape or ellipsoidal shape in plan view at a center of the first resin mold, and made of a first thermosetting resin; a plurality of lead frames arranged on a bottom surface of the concave portion and electrically connected to the light emitting element; and a second resin mold body made of a second thermosetting resin filled in the concave portion, wherein the light emitting element is placed on the lead frame and a surface of the second resin mold body serves as a light emitting surface, is characterized in that a gate remain, which is formed by cutting off a gate to be formed on the external side surface of the first resin mold body when the first thermosetting resin is injected into a predetermined die, is formed on an extended line of a normal line at one point of a circular cross section or ellipsoidal cross section of the concave portion toward a normal line direction.

According to the feature described above, the first thermosetting resin at the time of injection flows toward the normal direction of the concave portion, and hits against a portion corresponding to the concave portion of the die to split. Each of the split flows of the first thermosetting resin intermingles with each other at a position opposite to the injection port across the center of the concave portion. Therefore, a time until the intermingling can be shortened compared with the conventional method, and thereby the each of the split flows of the first thermosetting resin joins together and intermingles with each other to cause a sufficient curing reaction. As a result, a strong weld line can be formed.

In addition, a gate remain according to the present invention is characterized in that the gate remain is perpendicularly disposed on the external side surface. According to the feature described above, since the first thermosetting resin at the time of injection hits against a portion corresponding to the concave portion of the die and splits substantially equally, the time until the intermingling can be shortened. In addition, since each of the split flows of the first thermosetting resin joins together and intermingles with each other to cause a sufficient curing reaction, a strong weld line can be formed.

In addition, a first resin mold body according to the present invention is characterized in that the first resin mold body is made of a resin containing triazine derivative epoxy resin. Especially, it is preferable that the first resin mold body is made of a resin containing 1,3,5-triazine derivative epoxy resin. A curing reaction of the first thermosetting resin described above is fast and a robust first resin mold body can be formed. In addition, since the time until the intermingling can be shortened compared with the conventional method by arranging the injection port as described above even if a curing reaction speed of the first thermosetting resin is increased, a manufacturing speed of the first resin mold body can be synergistically increased.

In addition, a package according to the present invention, which includes: a first resin mold body having an external side surface and provided with a concave portion having a circular shape or ellipsoidal shape in plan view at a center of the first resin mold body; and a plurality of lead frames arranged on a bottom surface of the concave portion, is characterized in that a gate remain, which is formed by cutting off a gate to be formed on the external side surface of the first resin mold body when a first thermosetting resin is injected into a predetermined die, is formed on an extended line of a normal line at one point of a circular cross section or ellipsoidal cross section of the concave portion toward a normal line direction.

According to the feature described above, the first thermosetting resin at the time of injection flows toward the normal line direction of the concave portion, and hits against a portion corresponding to the concave portion of the die to split. Each of the split flows of the first thermosetting resin intermingles with each other at a position opposite to the injection port across the center of the concave portion. As a result, the time until the intermingling can be shortened compared with the conventional method. In addition, since the each of the split flows of the first thermosetting resin joins together and intermingles with each other to cause a sufficient curing reaction, a strong weld line can be formed.

In addition, a gate remain according to the present invention is characterized in that the gate remain is perpendicularly disposed on the external side surface. According to the feature described above, since the first thermosetting resin at the time of injection hits against a portion corresponding to the concave portion of the die and splits substantially equally, each of the split flows of the first thermosetting resin joins together and intermingles with each other to cause a sufficient curing reaction. As a result, a stronger weld line can be formed.

In addition, a first resin mold body according to the present invention is characterized in that the first resin mold body is made of a resin containing triazine derivative epoxy resin. Especially, it is preferable that the first resin mold body is made of a resin containing 1,3,5-triazine derivative epoxy resin. A curing reaction of the first thermosetting resin described above is fast and a robust first resin mold body can be formed. In addition, since the time until the intermingling can be shortened compared with the conventional method by arranging the injection port as described above even if a curing reaction speed of the first thermosetting resin is increased, a manufacturing speed of the first resin mold body can be synergistically increased.

In addition, a package manufacturing die according to the present invention for manufacturing a package, which includes: a first resin mold body having an external side surface and provided with a concave portion having a circular shape or ellipsoidal shape in plan view at a center of the first resin mold body and a plurality of lead frames arranged on a bottom surface of the concave portion, is characterized in that the package manufacturing die includes a pair of an upper die and a lower die, wherein the upper die or the lower die is provided with recesses where the lead frames are disposed, wherein the upper die includes: an external wall portion formed in a frame shape; a protruding portion whose a bottom surface is in contact with a plurality of the lead frames and used for forming the concave portion; a concave groove portion formed between the external wall portion and the protruding portion; and an injection port disposed in the external wall portion and on an extended line of a normal line at one point of a circular cross section or ellipsoidal cross section of the protruding portion toward a normal line direction.

According to the feature described above, the first thermosetting resin at the time of injection flows toward the normal line direction of the protruding portion and hits against the protruding portion to split. Each of the split flows of the first thermosetting resin fills the space along an outer periphery of the protruding portion and intermingles with each other at a position opposite to the injection port across the center of the protruding portion. Therefore, a time until the intermingling can be shortened compared with the conventional method, and thereby the each of the split flows of the first thermosetting resin joins together and intermingles with each other to cause a sufficient curing reaction. As a result, a strong weld line can be formed.

In addition, an injection port according to the present invention is characterized in that the injection port is perpendicularly disposed on the external wall portion. According to the configuration described above, since the first thermosetting resin at the time of injection hits against a portion, with which the concave portion is formed, of the die and splits, each of the split flows of the first thermosetting joins together and intermingles with each other to cause a sufficient curing reaction. Accordingly, a stronger weld line can be formed.

In addition, a manufacturing method according to the present invention for manufacturing a light emitting device, which includes: a light emitting element; a first resin mold body having an external side surface and provided with a concave portion having a circular shape or ellipsoidal shape in plan view at a center of the first resin mold body; a plurality of lead frames arranged on a bottom surface of the concave portion and electrically connected to the light emitting element; and a second resin mold body made of a second thermosetting resin filled in the concave portion, wherein the light emitting element is placed on the lead frame and a surface of the second resin mold serves as a light emitting surface, is characterized in that the manufacturing method includes steps of: a first process for sandwiching the lead frames by an upper die, which is provided with a protruding portion to be contacted with the lead frames and used for forming the concave portion, and a lower die paired with the upper die; a second process for injecting a first thermosetting resin into a space formed by the upper die and the lower die toward a normal line direction of a circular cross section or ellipsoidal cross section of the protruding portion; a third process for heating up the injected first thermosetting resin for curing; a fourth process for releasing the upper die; a fifth process for cutting off a gate formed in the injection port portion; a sixth process for placing the light emitting element on the lead frame to be arranged on a bottom surface of the concave portion and electrically connecting the light emitting element and the lead frame; a seventh process for filling a second thermosetting resin in the concave portion; and an eighth process for heating up the second thermosetting resin for curing.

According to the feature described above, the first thermosetting resin at the time of injection flows toward the normal line direction of the circular cross section or ellipsoidal cross section of the protruding portion, and hits against the protruding portion to split. Each of the split flows of the first thermosetting resin fills the space along the outer periphery of the protruding portion, and intermingles with each other at a position opposite to the injection port across the center of the protruding portion. Therefore, a time until the intermingling can be shortened compared with the conventional method, and thereby the each of the split flows of the first thermosetting resin joins together and intermingles with each other to cause a sufficient curing reaction. As a result, a strong weld line can be formed.

In addition, a first thermosetting resin according to the present invention is characterized in that the first thermosetting resin is a resin containing triazine derivative epoxy resin. Especially, it is preferable that the first resin mold body is made of a resin containing 1,3,5-triazine derivative epoxy resin. A curing reaction of the first thermosetting resin described above is fast and a robust first resin mold body can be formed. In addition, since the time until the intermingling can be shortened compared with the conventional method by arranging the injection port as described above even if a curing reaction speed of the first thermosetting resin is increased, a manufacturing speed of the first resin mold body can be synergistically increased.

In addition, a manufacturing method according to the present invention for manufacturing a package, which includes a first resin mold body having a plurality of external side surfaces and provided with a concave portion having a circular shape or ellipsoidal shape in plan view at a center of the first resin mold body and a plurality of lead frames arranged on a bottom surface of the concave portion, is characterized in that the manufacturing method includes steps of: a first process for sandwiching the lead frames by un upper die, which is provided with a protruding portion to be contacted with the lead frames and used for forming the concave portion, and a lower die paired with the upper die; a second process for injecting a first thermosetting resin into a space formed by the upper die and the lower die toward a normal line direction of a circular cross section or ellipsoidal cross section of the protruding portion; a third process for heating up the injected first thermosetting resin for curing; a fourth process for releasing the upper die; and a fifth process for cutting off a gate formed in the injection port portion.

According to the feature described above, the first thermosetting resin at the time of injection flows toward the normal line direction of the circular cross section or ellipsoidal cross section of the protruding portion, and hits against the protruding portion to split. Each of the split flows of the first thermosetting resin fills the space along the outer periphery of the protruding portion, and intermingles with each other at a position opposite to the injection port across the center of the protruding portion. Therefore, a time until the intermingling can be shortened compared with the conventional method, and since a temperature difference between the each of the split flows of the first thermosetting resin can be reduced, a strong weld line can be formed.

In addition, a first thermosetting resin according to the present invention is characterized in that the first thermosetting resin is a resin containing triazine derivative epoxy resin. Especially, it is preferable that the first resin mold body is made of a resin containing 1,3,5-triazine derivative epoxy resin. A curing reaction of the first thermosetting resin described above is fast and a robust first resin mold body can be formed. In addition, since the time until the intermingling can be shortened compared with the conventional method by arranging the injection port as described above even if a curing reaction speed of the first thermosetting resin is increased, a manufacturing speed of the first resin mold body can be synergistically increased.

Effects of the Invention

According to the light emitting device and package of the present invention, since the light emitting device and package has the first resin mold body provided with the strong weld line, the light emitting device and package can be prevented from generating cracks. In addition, according to the package manufacturing die described above, since the first resin mold body provided with the strong weld line can be formed, the package can be prevented from generating cracks. According to the manufacturing method of the light emitting device and manufacturing method of the package, since the first resin mold body provided with the strong weld line can be formed, the light emitting device and package can be prevented from generating cracks. Especially, if a resin having a large thermal expansion coefficient such as silicone resin or modified silicone resin is used for the second resin mold body, the second resin mold body largely expands and contracts on heating and cooling. Due to the expansion and contraction of the second resin mold body at the time, an extremely large stress is generated in the first resin mold body. However, since a sufficient strength is secured in the weld portion, the light emitting device and package can be prevented from generating cracks.

BRIEF DESCRIPTION OF THE DRAWINGS

FIG. 1 is a perspective view showing a light emitting device according to a first embodiment of the present invention;

FIG. 2 is an illustration showing a light emitting device according to the first embodiment of the present invention, and which is a cross sectional view taken along A-A line of FIG. 1;

FIG. 3 is a plan view showing a light emitting device according to the first embodiment of the present invention;

EXPLANATION ON SYMBOLS

Figure 4:
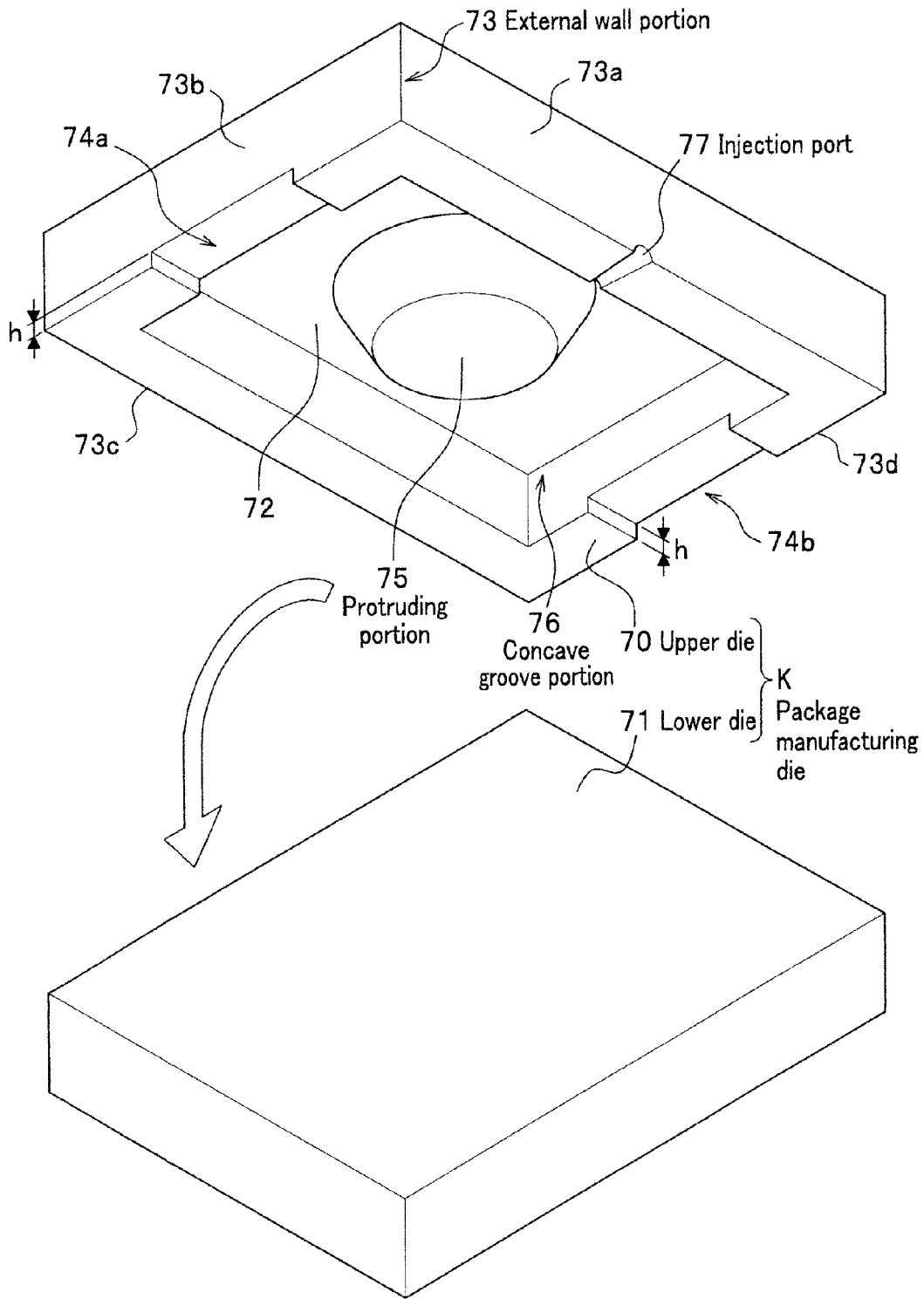
FIG. 4 is a perspective view showing a die for manufacturing a package in a method for manufacturing a light emitting device according to the first embodiment of the present invention.

1 Light emitting device
2 Light emitting element
10 First resin mold body
10a Concave portion
11 External side surface
20 First lead frame
30 Second lead frame
50 Gate remain
60 Weld line
70 Upper die
71 Lower die
73 External wall portion
75 Protruding portion
77 Injection port
90 Package
J First thermosetting resin
K Package manufacturing die

BEST MODE FOR CARRYING OUT THE INVENTION

Hereinafter, best modes of a light emitting device, a package, a die for manufacturing the package, a method for manufacturing the light emitting device, and a method for manufacturing the package of the present invention will be explained in details by referring to drawings.

First Embodiment

FIG. 1 is a perspective view showing a light emitting device according to a first embodiment of the present invention. FIG. 2 is an illustration showing the light emitting device according to the first embodiment of the present invention, and which is a cross sectional view taken along A-A line of FIG. 1. FIG. 3 is a plan view showing the light emitting device according to the first embodiment of the present invention.

The light emitting device 1 according to the first embodiment includes a light emitting element 2, a first resin mold body 10 on which the light emitting element 2 is placed, a first lead frame 20 and a second lead frame 30 which are arranged underneath the first resin mold body 10 and electrically connected to the light emitting element 2, and a second resin mold body 40 to be filled in a concave portion 10a of the first resin mold body 10. In addition, a gate remain 50 is formed on a side surface of the first resin mold body 10 and a weld line 60 is formed inside the first resin mold body 10.

<First Resin Mold Body>

The first resin mold body 10 is, as shown in FIG. 1, a base of the light emitting device 1 and a member for having a light of the light emitting element 2, which is arranged in a lower portion of the first resin mold body 10, effectively output. The first resin mold body 10 has substantially a rectangular solid shape and is provided with a concave portion 10a at the center. An external side surface on which a gate remain 50 is formed among four side surfaces composing the first resin mold body 10 is named a first external side surface 11a. The other side surfaces are named a second external side surface 11b, a third external side surface 11c, and a fourth external side surface 11d, respectively, in the clockwise direction from the first external side surface 11a.

The concave portion 10a includes a side surface portion 10b and a bottom surface 10c, and has a circular truncated cone shape which becomes narrower toward the bottom surface 10c. A light emitted from the light emitting element 2 is reflected by the side surface portion 10b, and can be focused or diffused by changing an angle of the side surface portion 10b. The bottom surface 10c is composed of a first lead frame 20, a second lead frame 20, and a gap 10e which is apart of the first resin mold body 10, which will be described later. The gap 10e is disposed between the first lead frame 20 and the second lead frame 30 so that no short-circuit is formed between the first lead frame 20 and the second lead frame 30. Regarding a slope angle of the side surface portion 10b, it is preferable that an opening angle of the side surface portion 10b from the bottom surface is not less than 95 degrees and not more than 150 degrees, and more preferably not less than 100 degrees and not more than 120 degrees.

It is noted that the concave portion 10a may be formed in a cylindrical form without forming a slope. In addition, the side surface portion 10b is not always required to be flat, but may be formed irregular for improving adhesiveness of the interface between the first resin mold body 10 and a second resin mold body 40 described later. In addition, although the concave portion 10a is formed in a circular shape in plan view in the first embodiment, but may be formed in an ellipsoidal shape. In addition, although the first resin mold body 10 is formed in a rectangular shape, but may be formed in a circular shape, an ellipsoidal shape, or other polygonal shapes in plan view.

It is preferable that the first resin mold body 10 is excellent in heat resistance and light resistance, as well as rigid for protecting the light emitting element 2. Therefore, the first resin mold body 10 is made of a first thermosetting resin containing triazine derivative epoxy resin. The first thermosetting resin is excellent in heat resistance and light resistance, as well as excellent in adhesiveness to the first lead frame 20 and the second lead frame 30. In addition, since the first thermosetting resin is excellent in fluidity, the first thermosetting resin can be filled well even in the first resin mold body (die), which has a complex shape. In addition, the first thermosetting resin contains acid anhydride, antioxidant, a mold release agent, a light reflective material, a inorganic filler, a curing catalyst, a light stabilizer, and an antifriction. Titanium dioxide is used for the light reflective material and the light reflective material occupies 10 to 60 wt/% (weight percentage) in the first thermosetting resin. It is noted that the first resin mold body 10 is formed to reflect not less than 70% of a light having a wavelength not less than 430 nm.

In the first embodiment, the first resin mold body 10 is formed as described above. However, the first resin mold body 10 may be formed in other configurations. For example, the first thermosetting resin may be composed of at least one selected from a group of epoxy resin, modified epoxy resin, silicone resin, modified silicone resin, aclyrate resin, and urethane resin. For example, a solid epoxy resin composition may be used. The solid epoxy resin composition is prepared as follows. Epoxy resin composed of triglycidylisocyanurate (chemical 1), bisphenolAdiglycidyletherhydride (chemical 2), and others and acid anhydride, which has an equivalent weight of that of the epoxy resin, composed of hexahydrophthalic acid anhydride (chemical 3), 3-methylhexahydrophthalic acid anhydride (chemical 4), 4-methylhexahydrophthalic acid anhydride (chemical 5) and others are mixed to prepare a transparent and colorless mixture of 100 weight parts. Next, DBU (1,8-Diazabicycro(5,4,0) undecene-7) (chemical 6) of 0.5 weight parts as a curing promoter, ethylene glycol (chemical 7) of 1 weight part as a catalyst prompter, titanium oxide pigment of 10 weight parts, and glass fibers of 50 weight parts are added to the mixture and heated up for partially promoting curing reaction to form B-staged solid epoxy resin composition.

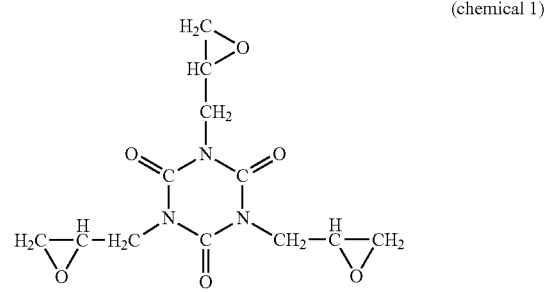

(chemical 1)

-continued

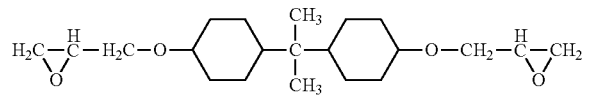
(chemical 2)

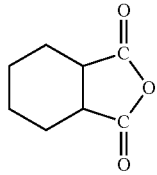
(chemical 3)

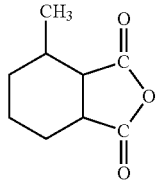
(chemical 4)

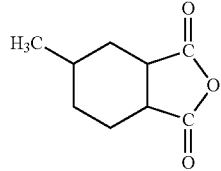
(chemical 5)

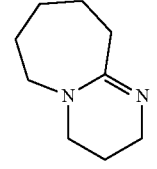
(chemical 6)

HO—CH$_2$—CH$_2$—OH
(chemical 7)

In addition, it is no object whether the first resin mold body 10 is transparent or not, and the first resin mold body 10 may be designed as appropriate according to, for example, the application. For example, a light which transmits the first resin mold body 10 may be reduced by mixing a light blocking material into the first thermosetting resin. On the other hand, a diffusing agent may be mixed into the first thermosetting resin so that a light emitted from the light emitting device 1 is mainly output to a light emitting surface and the side surfaces. In addition, a white pigment rather than dark pigment may be added for reducing absorption of the light. As described above, the first thermosetting resin may be mixed as appropriate with at least one selected from a group of a diffusing agent, pigment, fluorescent material, reflective material, light blocking material, light stabilizer, and lubricant for giving a predetermined function to the first resin mold body 10.

It is noted that a stress-focusing portion is generated in the first resin mold body 10 by expansion and contraction of a second thermosetting resin used for a second resin mold body 40 described later. Therefore, it is preferable that the first resin mold body 10 is designed so that a weld line 60 described later is not overlapped on the stress-focusing portion.

<First Lead, Second Lead>

The first lead frame 20 and the second lead frame 30 are a pair of electrodes of positive electrode and negative electrode which electrically connect external electrodes (not shown) and the light emitting element 2 as shown in FIG. 1 to FIG. 3. The first lead frame 20 and the second lead frame 30 are metal plates disposed beneath the first resin mold body 10 with a given gap (gap 10e), and extend to each side of the first resin mold body 10, respectively, from the bottom portion 10c of the concave portion 10a.

The first lead frame 20 includes, as shown in FIG. 2, a first inner lead portion 20a forming the bottom surface 10c of the concave portion 10a and a first outer lead portion 20b exposed outside from the first resin mold body 10. A back side of the first lead frame 20 is also called as the first outer lead portion 20b.

The first inner lead portion 20a composes a part of the bottom surface 10c of the concave portion 10a, and the light emitting element 2 is placed on the first inner lead portion 20a through a die bonding member. The first inner lead portion 20a and the light emitting element 2 are electrically connected through a wire W. The first inner lead portion 20a is required to have an area in which at least the light emitting element 2 can be placed. However, a larger area is preferable in consideration of, for example, a thermal conductivity, electric conductivity, and reflection efficiency. The first outer lead portion 20b is electrically connected to an external electrode, as well as has a thermal conducting function.

The second lead frame 30 includes a second inner lead portion 30a forming the bottom surface 10c of the concave portion 10a and a second outer lead portion 30b exposed outside from the first resin mold body 10. A backside of the second lead frame 30 is also called as the second outer lead portion 30b.

The second inner lead portion 30a composes a part of the bottom surface 10c of the concave portion 10a, and electrically connected to the light emitting element 2 through the wire W. The second inner lead portion 30a is required to have an area to which at least an electrode of the light emitting element 2 can be connected. However, a larger area is preferable in consideration of the reflection efficiency.

It is noted that in the first embodiment, as shown in FIG. 3, a surface area of the first inner lead portion 20a is formed larger than that of the second inner lead portion 30a, both of the surface areas form the bottom surface 10c, for placing the light emitting element 2 on the first inner lead portion 20a.

The first inner lead portion 20a and the second inner lead portion 30a are formed to have the same surface height as shown in FIG. 2. With this configuration, a mounting stability of the light emitting device 1 can be improved, as well as electrical wirings can be implemented from backsides of the first lead frame 20 and the second lead frame 30.

The first lead frame 20 and the second lead frame are formed using an electrically good conductor, for example, iron, phosphor bronze, cupper alloy, or the like. In addition, the first lead frame 20 and the second lead frame 30 may be metal-plated by, for example, silver, aluminum, cupper, and gold for increasing a reflection efficiency of a light emitted from the light emitting element 2. In addition, it is preferable that surfaces of the first lead frame 20 and the second lead frame 30 are formed to be smooth for increasing surface reflection efficiencies of the first lead frame 20 and the second lead frame 30. In addition, areas of the first lead frame 20 and the second lead frame 30 may be formed larger for increasing heat dissipations of the first lead frame 20 and the second lead frame 30. Through this, a temperature rise of the light emitting element 2 can be effectively suppressed, and as a result, a relatively high current can be flown in the light emitting element 2.

In addition, the first lead frame 20 and the second lead frame 30 may be formed thick to increase the heat dissipation.

In this case, since a forming work such as a bending work of the first lead frame 20 and the second lead frame 30 becomes difficult, it is preferable that the first lead frame 20 and the second lead frame 30 are formed after cutting a raw material in a predetermined size. In addition, if the first lead frame 20 and the second lead frame 30 are formed thick, the light emitting element 2 can be easily placed due to reductions of deflections of the first lead frame 20 and the second lead frame 30. On the other hand, if the first lead frame 20 and the second lead frame 30 are formed with a thin plate, the bending work becomes easy to form a predetermined shape with ease. In addition, in the first embodiment, the first lead frame 20 and the second lead frame 30 are formed in a rectangular shape in plan view, however, may be formed in another shape. As with the first embodiment, at least a pair of electrodes of positive electrode and negative electrode (first lead frame 20 and second lead frame 30) are required. However, more than three lead frames may be disposed.

It is noted that a molded product composed of the first resin mold body 10, the first lead frame 20, and the second lead frame 30 is called a package.

<Second Resin Mold Body>

A second resin mold body 40 is, as shown in FIG. 1, a member for having a light emitted from the light emitting element 2 effectively output outside, as well as protecting the light emitting element 2 from external forces, dusts, and moisture from the external environment.

In the first embodiment, the second resin mold body 40 is made of a second thermosetting resin which contains triazine derivative epoxy resin. It is preferable that the second thermosetting resin is composed of at least one selected from a group of silicon-containing resin, epoxy resin, modified epoxy resin, silicone resin, modified silicone resin, acrylate resin, and urethane resin. Especially, epoxy resin, modified epoxy resin, silicone resin, and modified silicone resin are preferable.

In the first embodiment, both of the first resin mold body 10 and the second resin mold body 40 are made of thermosetting resins, and since the thermosetting resins having a similar physical property, for example, a thermal expansion coefficient are selected, adhesiveness between the first resin mold body 10 and the second resin mold body 40 is excellent. Further, the light emitting device 1 which is excellent in heat resistance, light resistance, and fluidity may be provided.

A hard resin is preferable for the second resin mold body 40 for protecting the light emitting element 2. In addition, it is preferable that a thermosetting resin excellent in heat resistance, weather resistance, and light resistance is used for the second resin mold body 40. The second resin mold body 40 may be mixed with at least one selected from a group of a filler, diffusing agent, pigment, fluorescent material, and reflective material for giving a predetermined function. In addition, the second thermosetting resin may include a diffusing agent. As a specific diffusing agent, for example, barium titanate, titanium oxide, aluminum oxide, and silicon oxide may be preferably used. In addition, an organic or inorganic color dye or color pigment may be included for cutting a light of non-desired wavelengths.

In addition, in each embodiment, the explanation has been made, but not in details, such that a fluorescent material to be mixed into the second resin mold body 40 absorbs a light emitted from the light emitting element 2 and converts a wavelength of the light into others. Specifically, the following fluorescent materials are preferably used. Namely, it is preferable that the fluorescent material is at least one selected from a group of, for example, nitride fluorescent materials, oxynitride fluorescent materials, and sialon fluorescent materials, all of which are activated mainly by lanthanoid elements such as Eu and Ce, alkaline earth halogen apatite fluorescent materials, alkaline earth metal boric-acid halogen fluorescent materials, alkaline earth metal aluminate fluorescent materials, alkaline earth silicates, alkaline earth sulfides, alkaline earth thiogallates, alkaline earth silicon nitrides, and germinates, all of which are activated mainly by an element of lanthanoid elements such as Eu and transition metals such as Mn, or rare earth aluminates and rare earth silicates, all of which are mainly activated by lanthanoid elements such as Ce, or organics and organic complexes which are activated mainly by lanthanoid elements such as Eu. Specifically, the following fluorescent materials may be used, but not limited to these.

The nitride fluorescent materials to be activated mainly by lanthanoid elements such as Eu and Ce are, for example, $M_2Si_5N_8$:Eu and $CaAlSiN_3$:Eu (M is at least one selected from a group of Sr, Ca, Ba, Mg, and Zn). In addition, the nitride fluorescent materials are, for example, $MSi_7N_{10}$:Eu, $M_{1.8}Si_5O_{0.2}N_8$:Eu, and $M_{0.9}Si_7O_{0.1}N_{10}$:Eu (M is at least one selected from a group of Sr, Ca, Ba, Mg, and Zn).

One of the oxynitride fluorescent materials to be activated mainly by lanthanoid elements such as Eu and Ce is, for example, $MSi_2O_2N_2$:Eu (M is at least one selected from a group of Sr, Ca, Ba, Mg, and Zn).

One of the sialon fluorescent materials to be activated mainly by lanthanoid elements such as Eu and Ce is, for example, $M_{p/2}Si_{12-p-q}Al_{p+q}O_qN_{16-p}$:Ce, which is composed of M—Al—Si—O—N (M is at least one selected from a group of Sr, Ca, Ba, Mg, and Zn, q:0 to 2.5, p:1.5 to 3).

One of the alkaline earth halogen apatite fluorescent materials to be activated mainly by an element of lanthanoid elements such as Eu and transition metals such as Mn is, for example, $M_5(PO_4)_3X$:R (M is at least one selected from a group of Sr, Ca, Ba, Mg, and Zn. X is at least one selected from a group of F, Cl, Br, and I. R is at least one selected from a group of Eu, Mn, and Eu+Mn.)

One of the alkaline earth metal boric-acid halogen fluorescent materials is, for example, $M_2B_5O_9X$:R (M is at least one selected from a group of Sr, Ca, Ba, Mg, and Zn. X is at least one selected from a group of F, Cl, Br, and I. R is at least one selected from a group of Eu, Mn, and Eu+Mn.).

The alkaline earth metal aluminate fluorescent materials are, for example, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from a group of Eu, Mn, and Eu+Mn.).

The alkaline earth sulfide fluorescent materials are, for example, $La_2O_2S$:Eu, $Y_2O_2S$:Eu, and $Gd_2O_2S$:Eu.

One of the rare earth aluminate fluorescent materials to be activated mainly by an element of lanthanoid elements such as Ce is, for example, a YAG fluorescent material which is expressed with the following compositional formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$. In addition, the rare earth aluminate fluorescent materials are, for example, $Tb_3Al_5O_{12}$:Ce and $Lu_3Al_5O_{12}$:Ce, in which a part or all of Y in the YAG fluorescent material are substituted by, for example, Tb or Lu.

A fluorescent material other than those described above is, for example, ZnS:Eu, $Zn_2GeO_4$:Mn, and $MGa_2S_4$:Eu (M is at least one selected from a group of Sr, Ca, Ba, Mg, and Zn. X is at least one selected from a group of F, Cl, Br, and I.)

The fluorescent materials described above may include at least one selected from a group of Tb, Cu, Ag, Au, Cr, Nd, Dy, Co, Ni, and Ti instead of Eu or in addition to Eu as needed.

In addition, a fluorescent material other than those described above may be used as long as the fluorescent material has an equal performance and effect to those described above.

A fluorescent material which has an emission spectrum of yellow, red, green, or blue through an excitation light of the light emitting element 2 may be used. In addition, a fluorescent material which has an emission spectrum of yellow, blue-green, or orange, which is an additive color of the above colors, may also be used. By combining these fluorescent materials variously, a light emitting device which emits various kinds of emission spectra may be manufactured.

For example, the fluorescent material $Y_3Al_5O_{12}$:Ce or $(Y_{0.8}Gd_{0.2})3Al_5O_{12}$:Ce is irradiated with a blue light emitted from a GaN compound semiconductor for converting a wavelength of the blue light. Therefore, for example, alight emitting device which emits a white light, which is a mixed color of the blue light emitted from the light emitting element 2 and a light emitted from the fluorescent material, can be provided.

For example, by using fluorescent materials composed of $CaSi_2O_2N_2$:Eu or $SrSi_2O_2N_2$:Eu which emits green to yellow, $(Sr, Ca)_5(PO_4)_3Cl$:Eu which emits blue, and $(Ca, Sr)_2Si_5N_8$:Eu which emits red, a light emitting device which emits a white light, which has an excellent color rendering property, can be provided. In this case, since red, blue, and green, that is, the three primary colors, are used, a desired white light can be obtained only by changing compounding ratios of the first fluorescent material and the second fluorescent material.

<Gate Remain>

As shown in FIG. 1, the gate remain 50 is a protrusion of a resin mold body remaining at an injection port through a cutting process, which is a secondary work, of the resin mold body formed in the injection port portion when the first thermosetting resin is injected from the injection port (see injection port 77 in FIG. 4) of a die, which will be described later.

In the first embodiment, the gate remain 50 is formed to protrude perpendicular to the first external side surface 11a of the first resin mold body 10. In the first embodiment, since a cross section of the injection port is a semicircular shape, the gate remain 50 has a columnar shape having a semicircular cross section. That is, a shape of the gate remain 50 is formed in accordance with the cross section of the injection port.

<Weld Line>

As shown in FIG. 1, the weld line 60 is a buffer layer in an interface portion produced by various kinds of external factors such as a fluidity of resin, a variation of resin viscosity, a time difference between injected resins, and the like when the first thermosetting resin is injected.

The weld line 60 is formed at a position where each of the split flows of the first thermosetting resin injected from an injection port of a die described later intermingles with each other. In the first embodiment, since the first thermosetting resin is injected from the first external side surface 11a on which the gate remain 50 exists, the weld line 60 is formed at a position opposite to the gate remain 50 across the center of the concave portion 10a. That is, in the first embodiment, the weld line 60, the center of the concave portion 10a, and the gate remain 50 are formed to be in line. Specifically, a stress-focusing portion due to expansion and contraction of the second thermosetting resin used for the second resin mold body 40 is produced in the first mold body 10. Therefore, it is preferable to design the first resin mold body 10 so that the stress-focusing portion is not overlapped with the weld line 60 described later.

A relationship between the gate remain 50 and the weld line 60 will be explained in details in the explanation of the manufacturing process.

<Light Emitting Element>

As shown in FIG. 2, the light emitting element 2 is a member to be placed on the first inner lead portion 20a and emits a light. A structure where semiconductors, such as GaAlN, ZnS, ZnSe, SiC, GaP, GaAlAs, AlN, InN, AlInGaP, InGaN, GaN, and AlInGaN are deposited on a substrate as a light emitting layer is used in the light emitting element 2. A semiconductor structure is a MIS junction, a homostructure having a PIN junction or a PN junction, a heterostructure, or a double heterostructure. Various emission wavelengths from ultraviolet to infrared may be selected by changing a material of a semiconductor layer and a degree of mixed crystal of the material. The light emitting layer may be formed by a single quantum well structure or a multi quantum well structure, which is a thin film where a quantum effect appears.

If it is considered that the light emitting element 2 is used in the field, it is preferable to use gallium nitride compound semiconductors as a semiconductor material capable of fabricating a high intensity light emitting element 2. In addition, it is preferable to use gallium aluminum arsenide semiconductors or aluminum indium gallium phosphide semiconductors for obtaining a red light. However, various kinds of semiconductor materials may be used depending on the application.

As shown in FIG. 1, the wire W electrically connects the light emitting element 2 and the first lead frame 20, and the light emitting element 2 and the second lead frame 30. The wire W is required to form a good ohmic contact and a good mechanical connectivity with electrodes of the light emitting element 2, and to have a good electric conductivity and a good thermal conductivity. It is preferable that the thermal conductivity is not less than 0.01 cal/(sec) (cm$^2$) (° C./cm), and more preferably not less than 0.5 cal/(sec) (cm$^2$) (° C./cm). The wire W is disposed for electric conduction from directly on the light emitting element 2 to a wire bonding area where a wiring pattern is plated.

<Method for Manufacturing Light Emitting Device>

Figure 5A:
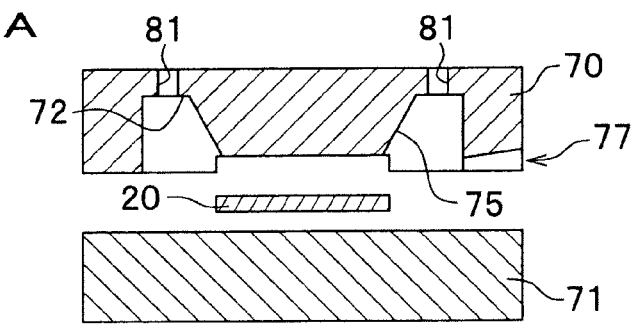
FIG. 5A is a cross sectional view showing an arrangement process of a method for manufacturing a light emitting device according to the first embodiment of the present invention.
Figure 5B:
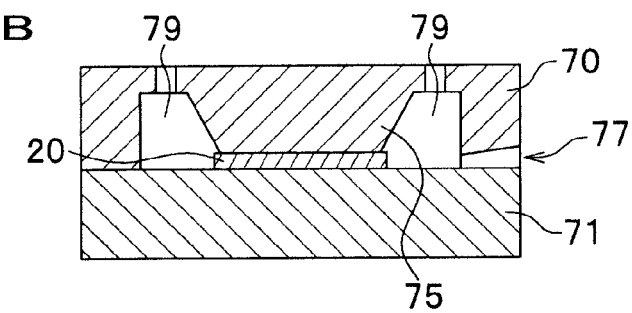
FIG. 5B is a cross sectional view showing a first process of the method for manufacturing the light emitting device according to the first embodiment of the present invention.
Figure 5C:
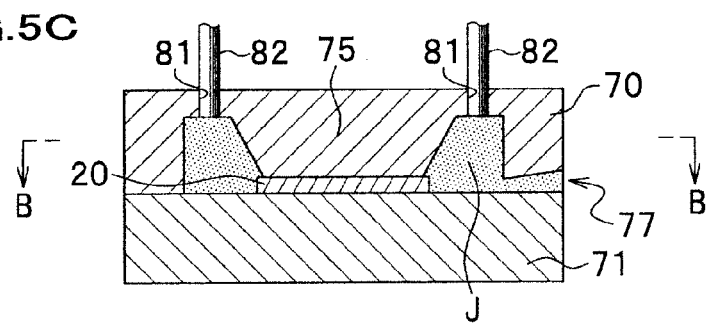
FIG. 5C is a cross sectional view showing a second process to a fourth process of the method for manufacturing the light emitting device according to the first embodiment of the present invention.
Figure 5D:
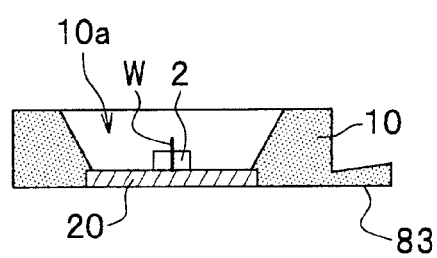
FIG. 5D is a cross sectional view showing a fifth process and a sixth process of the method for manufacturing the light emitting device according to the first embodiment of the present invention.
Figure 5E:
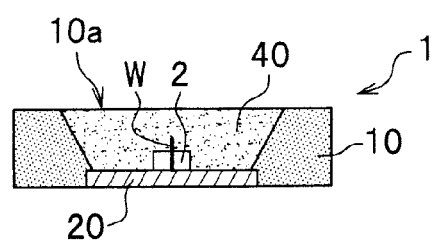
FIG. 5E is a cross sectional view showing a seventh process and an eighth process of the method for manufacturing the light emitting device according to the first embodiment of the present invention.

Next, a manufacturing method of a light emitting device according to the present invention will be explained. FIG. 4 is a perspective view showing a die for manufacturing a package in a method for manufacturing a light emitting device according to the first embodiment of the present invention. FIG. 5A to FIG. 5E are cross sectional views showing a method for manufacturing a light emitting device according to the first embodiment of the present invention, in which FIG. 5A is an illustration showing an arrangement process, FIG. 5B is an illustration showing a first process, FIG. 5C is an illustration showing a second process to a fourth process, FIG. 5D is an illustration showing a fifth process and a sixth process, and FIG. 5E is an illustration showing a seventh process and an eighth process.

In the method for manufacturing the light emitting device 1 according to the first embodiment, as shown in FIG. 4 and FIG. 5A to FIG. 5E, a die (die K for manufacturing package) composed of an upper die 70 and a lower die 71 is used. In the method, a package is molded by injecting the first thermosetting resin into a space 79 formed between the upper die 70 and the lower die 71 of the die K for manufacturing the package by a transfer molding. First, the upper die 70 and the lower die 71 will be explained.

As shown in FIG. 4, the upper die 70 includes a main body 72 which is a plate composing an upper portion of the upper die 70, external wall portion 73 formed like a frame from an edge of the main body 72, a first recess 74a and a second recess 74b formed on a pair of external wall portions 73 among the external wall portions 73, a protruding portion 75 forming the concave portion 10a of the first resin mold body 10, a concave groove portion 76 formed between the external wall portion 73 and the protruding portion 75, and an injection port 77 formed by cutting off a part of the external wall portion 73 through in a horizontal direction.

The external wall portion 73 is perpendicularly protruded from the edge of the main body 72, and includes a first external wall portion 73a, a second external wall portion 73b, a third external wall portion 73c, and a fourth external wall portion 73d which form the first external surface 11a, the second external surface 11b, the third external surface 11c, and the fourth external surface 11d of the resin mold body 10, respectively. That is, the external wall portion 73 is a portion for forming an external frame of the first resin mold body 10, and is formed in a rectangular shape in plan view in the first embodiment. A shape of the external wall portion 73 may be formed as needed depending on a desired shape of the first resin mold body 10.

The first recess 74a is a place with which the first lead frame 20 (see FIG. 1) closely comes in contact, and is formed by cutting off a lower end face of the second external wall portion 73b. A height h of the first recess 74a is formed substantially identical to a thickness of the first lead frame 20.

The second recess 74b is a place with which the second lead frame 30 (see FIG. 1) closely comes in contact, and is formed by cutting off a lower end face of the fourth external wall portion 73d. A height h of the second recess 74b is formed substantially identical to a thickness of the second lead frame 30.

It is noted that if not less than three lead frames are arranged, a recess may be formed as appropriate depending on shapes and arrangement positions of the lead frames.

The protruding portion 75 is a member disposed to be protruded at the center of the main body 72 to form the concave portion 10a. The protruding portion 75 has a truncated cone shape which becomes narrower toward downward. Therefore, a shape of the concave portion 10a to be formed in the first resin mold body 10 is formed to become narrower toward the bottom surface 10c. The bottom surface of the protruding portion 75 is formed flat so that the first lead frame 20 and the second lead frame 30 come in contact with the bottom surface in a first process described later. The protruding portion 75 may be formed as appropriate depending on a desired shape of the concave portion 10a of the first resin mold body 10.

The concave groove portion 76 is a space surrounded by the main body 72 and the external wall portion 73 except the protruding portion 75, where the space 79 (see FIG. 6) is formed by overlapping the upper die 70 with the lower die 71 described later.

The injection port 77 is a through hole for injecting a first thermosetting resin J, and formed at approximately the center of lower end of the first external wall portion 73a through in a horizontal direction. The injection port 77 has a semicircular cross section, and is formed to become narrower toward an exit portion from an entrance portion of the injection port 77. In addition, in the first embodiment, the injection port 77 is formed directed to the center of the protruding portion 75.

In addition, as shown in FIG. 5A, pin insertion holes 81, 81 passing through the main body 72 are formed on an upper portion of the upper die 70. The pin insertion hole 81 is a hole for inserting a pin 82 when the first resin mold body is released from the upper die 70.

The lower die 71 is, as shown in FIG. 5A to FIG. 5C, a plate having a predetermined thickness, and a surface of the plate if formed flat. The lower die 71 comes in contact with the upper die 70 to form the space 79.

It is noted that shapes of the upper die 70 and the lower die 71 are not limited to those described above, and may be changed as appropriate. Although not shown specifically, for example, a lower end face of the external wall portion 73 of the upper die 70 is formed flat without disposing a recess and a bottom surface of the protruding portion 75 is formed to be the same height with the lower end face of the external wall portion 73. On the other hand, a recess having a shape and thickness identical to those of the lead frame is formed in the lower die 71. Using the upper die and lower die described above, a package identical to that composed of the first resin mold body 10, the first lead frame 20, and the second lead frame 30 of the light emitting device 1 may also be manufactured.

Next, each manufacturing process will be explained.

First, as an arrangement process shown in FIG. 5A, the first lead frame 20 and the second lead frame 30 (not shown) are arranged between the upper die 70 and the lower die 71. The first lead frame 20 and the second lead frame 30 are arranged with a gap 10e (see FIG. 2) between the frames 20, 30 for preventing short-circuit.

Next, as a first process shown in FIG. 5B, the first lead frame 20 and the second lead frame 30 are sandwiched by the upper die 70 and the lower die 71. That is, a portion corresponding to the first inner lead portion 20a (see FIG. 2) of the first lead frame 20 and a portion corresponding to the second inner lead portion 30a of the second lead frame 30 come in contact with a bottom surface of the protruding portion 75. In this case, the space 79 is formed by the upper die 70 and the lower die 71, while the other end side of the first lead frame 20 and the other end side of the second lead frame 30 are exposed outside of the upper die 70 and the lower die 71.

Then, as a second process shown in FIG. 5C, the first thermosetting resin J is injected into the space 79 which is formed by the upper die 70 and the lower die 71 from the injection port 77 by transfer molding. Since the first lead frame 20 and the second lead frame 30 are sandwiched by the upper die 70 and the lower die 71, the first lead frame 20 and the second lead frame 30 are not flapped, thereby resulting in suppression of burr generation.

Then, the upper die 70 and the lower die 71 are heated up to heat up the first resin mold body J a predetermined time for curing (third process).

Then, as shown in FIG. 5C, the pin 82 is inserted in the pin insertion hole 81 to release the upper die 70 (fourth process). Through the processes described above, a package composed of the first resin mold body 10, the first lead frame 20, and the second lead frame 30 is completed. It is noted that if the curing is not sufficient, the package is heated up again to cure for obtaining a predetermined hardness.

Then, as shown in FIG. 5D, a gate 83 formed in the portion of the injection port 77 is cut off by a well known cutting machine along the first external surface 11a (see FIG. 1) (fifth process). Accordingly, the gate remain 50 is formed as a cutting remain of the gate 83.

Then, as shown in FIG. 5D, the light emitting element 2 is placed on an upper surface of the first lead frame 20, and the light emitting element 2 and the first lead frame 20 as well as the light emitting element 2 and the second lead frame 30 are electrically connected by the wires W, W, respectively (sixth process).

Then, as shown in FIG. 5E, the second thermosetting resin 40 is filled in the concave portion 10a (seventh process). As a method for filling the second thermosetting resin 40, a falling-drop method is used. Using the falling-drop method, an air remaining in the concave portion 10a can be effectively discharged. It is preferable that the second thermosetting resin 40 is mixed with a fluorescent material. Hence, a chroma control of the light emitting device can be easily implemented. It is noted that as a method for filling the second thermosetting resin, an injection means or an extrusion means may be used.

Then, the second thermosetting resin 40 is heated up for curing to mold the second resin mold body (eighth process).

Through the processes described above, the light emitting device 1 can be manufactured.

Figure 6:
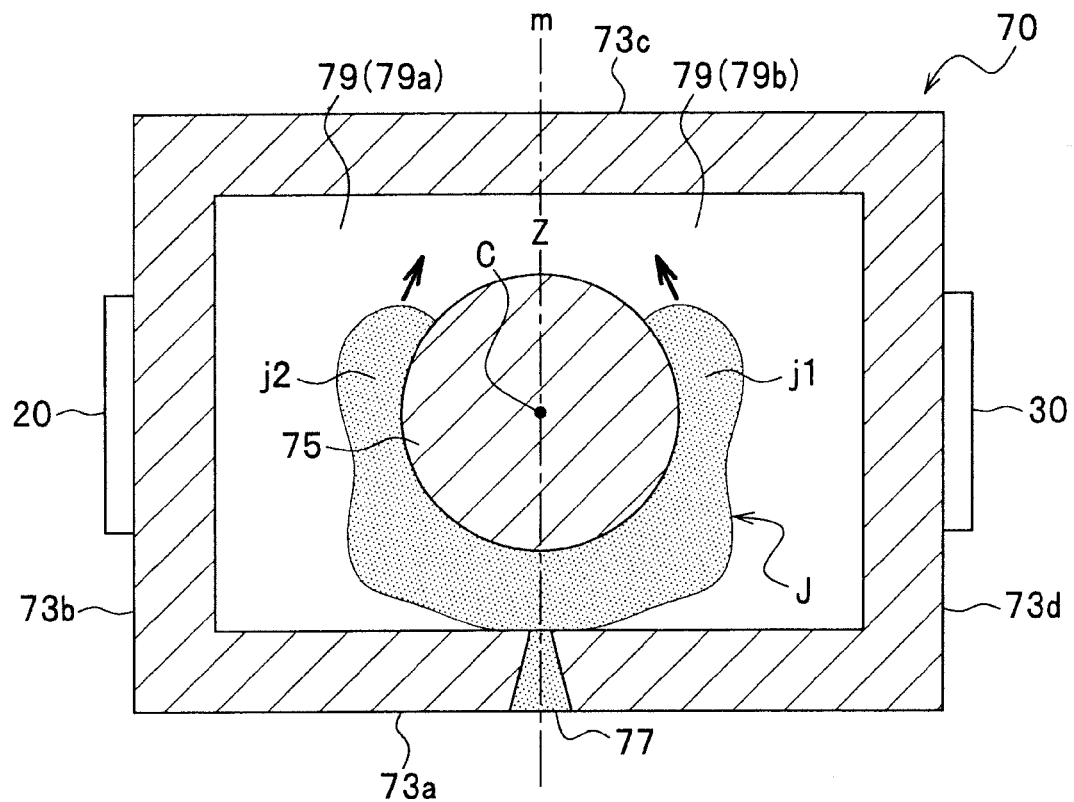
FIG. 6 is an illustration showing an upper die according to the first embodiment of the present invention, and which is a plan cross sectional view taken along B-B line of FIG. 5C.

Here, a relationship between the gate 83 (gate remain 50) and the weld line 60 will be explained in combination with a flow state of the first thermosetting resin J. FIG. 6 is an illustration showing an upper die according to the first embodiment of the present invention, and which is a plan cross sectional view taken along B-B line of FIG. 5C.

As shown in FIG. 6, the injection port 77 is on an extended line of a normal line m of a circular cross section of the protruding portion 75, and disposed toward a direction of the normal line m. In addition, since the protruding portion 75 is formed at the center of the upper die 70, a first space 79a of the space 79 on the left of the normal line m and a second space 79b of the space 79 on the right of the normal line m are formed in substantially the same volume.

The first thermosetting resin J which is injected from the injection port 77 moves in the direction of the normal line m of the protruding portion 75, hits against the protruding portion 75, and splits substantially equally into two first thermosetting resins j1, j2. Each of the first thermosetting resins j1, j2 flows along an outer periphery of the protruding portion 75 to fill the first space 79a and the second space 79b.

Therefore, the first thermosetting resins j1, j2 intermingle with each other at a position Z opposite to the injection port 77 across the center C of the protruding portion 75 to form the weld line 60 (see FIG. 3). On the other hand, at a position of the injection port 77, the gate 83 (see FIG. 5D) is formed, and the gate remain 50 is formed by cutting off the gate 83. The gate remain 50 formed as described above is formed toward a normal direction of the concave portion 10a.

That is, in the first embodiment, the gate remain 50, the center C of the protruding portion 75, and the weld line 60 are formed to be in line. Namely, since curing reactions of the first thermosetting resins j1, j2 to intermingle with each other progress substantially equally, there is no temperature difference between each of the resins j1, j2 to intermingle with each other, thereby resulting in substantially uniform intermingling. As a result, a stronger weld line 60 can be formed.

As explained above, since the light emitting device 1 according to the first embodiment has a strong weld line 60, the light emitting device 1 can be prevented from generating a crack. In addition, since the first thermosetting resin J includes 1,3,5-triazine derivative epoxy resin, the curing reaction is fast and a robust first resin mold body can be formed. In addition, since a time until the first thermosetting resins j1, j2 intermingle with each other can be shortened compared with the conventional method by disposing the injection port as described above even if a speed of the curing reaction of the first thermosetting resin is increased, a manufacturing speed of the first resin mold body can be synergistically increased.

As described above, the light emitting device, the package, the die for manufacturing the package, the method for manufacturing the light emitting device, and the method for manufacturing the package according to the present invention have been explained. However, various modifications are possible as appropriate without departing from the spirit and scope of the present invention. Hereinafter, modified examples of the package according to the present invention will be explained. It is noted that in the explanation of the modified examples, a member identical to that of the first embodiment is labeled the same symbol, and a duplicated explanation with the first embodiment will be omitted.

First Modified Example

Figure 7:
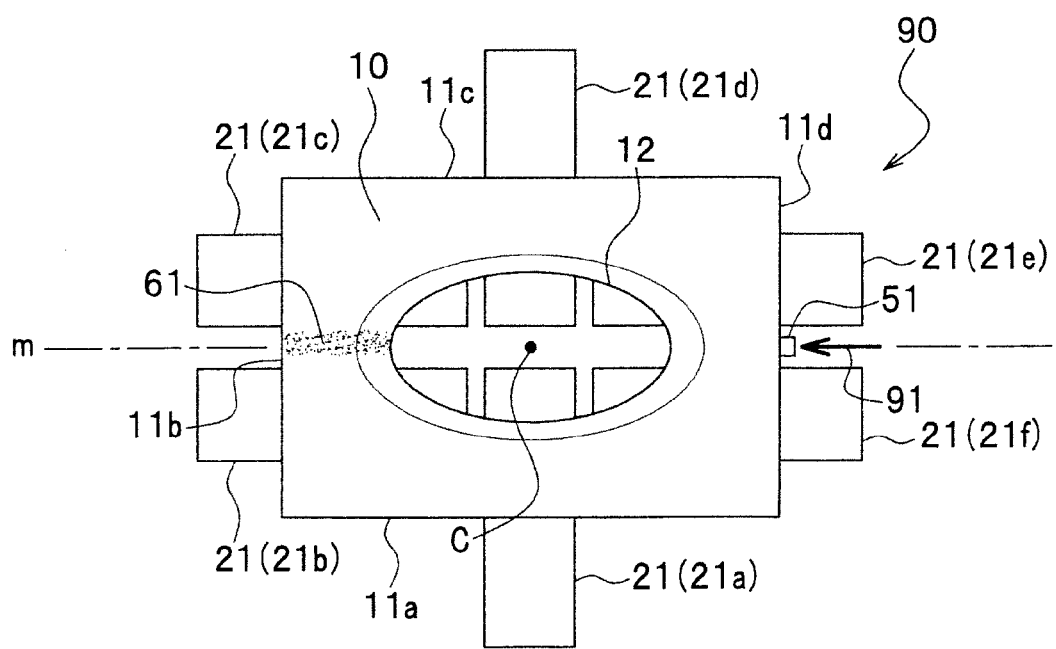
FIG. 7 is a plan view showing a first modified example of a package of the present invention.

FIG. 7 is a plan view showing a first modified example of a package according the present invention.

As shown in FIG. 7, a package 90 of the first modified example is different from the first embodiment in that six lead frames 21 are arranged and that a shape of a concave portion 12 is an ellipsoidal shape in plan view. That is, the package 90 includes the first resin mold body 10 which has a rectangular shape in plan view and has the first external side surface 11a, the second external side surface 11b, the third external side surface 11c, and fourth external side surface 11d, a first lead frame 21a disposed at the center of the first external side surface 11a, a second lead frame 21b and third lead frame 21c disposed on the second external side surface 11b with a predetermined interval, a fourth lead frame 21d disposed at the center of the third side surface 11c, and a fifth lead frame 21e and sixth lead frame 21f disposed on the fourth external side surface 11d with a predetermined interval. In addition, the first resin mold body 10 is provided with the concave portion 12 at the center thereof, and a gate remain 51 is formed on an extended line of a normal line m of the concave portion 12 toward a direction of the normal line. The weld line 61 is formed on an opposite side of the gate remain 51 across the center C of the concave portion 12. Namely, the gate remain 51, the center C of the concave portion 12, and the weld line 61 are formed to be in line.

As shown in FIG. 7, the weld line 61 is formed to be perpendicular against the second external side surface 11b. That is, in the package 90, the first thermosetting resin is injected into a perpendicular direction against the fourth external side surface 11d (see arrow 91). Through this, the first thermosetting resin hits against a protruding portion (not shown), with which the concave portion 12 is formed, of an upper die to split substantially equally into two flows, and intermingle again with each other at a position of the weld line 61. Therefore, each of the split two flows of the first thermosetting resin joins together and intermingles with each other to cause a sufficient curing reaction. As a result, a strong weld line 61 can be formed.

Here, looking at a contact portion between the weld line 61 and the lead frame 21, it can be seen that the weld line 61 is formed at a position where a thickness of the first resin mold body 10 is thinner than other positions by a thickness of the lead frame 21. That is, the weld line 61 which is low in strength is formed at a position where the first resin mold body 10 is thin and low in strength.

In this light, in the first modified example, the weld line 61 is formed at a position with which the lead frame 21 does not come in contact. That is, the weld line 61 and the gate remain 51 (injection port) are formed on an extended line of a normal line m of the concave portion 12 toward a normal line direction and between the lead frames 21, 21 in plan view of the package 90. With the configuration described above, since the thickness of the first resin mold body 10 at the weld line 61 can be sufficiently secured, the strong first resin mold body 10 can be molded.

Second Modified Example

Figure 8:
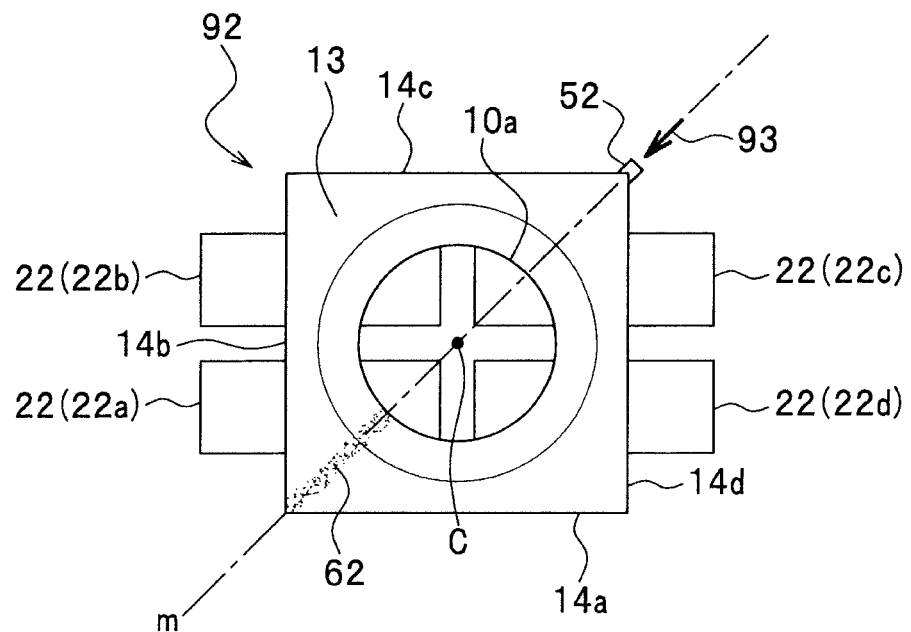
FIG. 8 is a plan view showing a second modified example of a package of the present invention.

FIG. 8 is a plan view showing a second modified example of a package according to the present invention.

As shown in FIG. 8, a package 92 of the second modified example is different from that of the first modified example in that a weld line 62 is formed diagonally in a first resin mold body 13 and that the first resin mold body 13 has a square shape in plan view. That is, the package 92 includes the first resin mold body 13, which has a square shape in plan view, having a first external side surface 14a, a second external side surface 14b, a third external side surface 14c, and a fourth external side surface 14d, a first lead frame 22a and second lead frame 22b disposed on the second external side surface 14b with a predetermined interval, and a third lead frame 22c and fourth lead frame 22d disposed on the fourth external side surface 14d with a predetermined interval. In addition, the first resin mold body 13 is provided with a concave portion 10a having a circular shape in plan view at the center thereof, and a gate remain 52 is formed on an extended line of a normal line m of the concave portion 10a toward a normal line direction.

That is, in the package 92, a gate remain 52 and a weld line 62 are formed on a diagonal line of the first resin mold body 13. In the configuration described above, an injected first thermosetting resin also fits against a protruding portion (not shown) of an upper die and substantially equally splits into two flows. Therefore, each of the split two flows of the first thermosetting resin joins together and intermingles with each other to cause a sufficient curing reaction. As a result, the strong weld line 62 can be formed.

Third Modified Example

Figure 9:
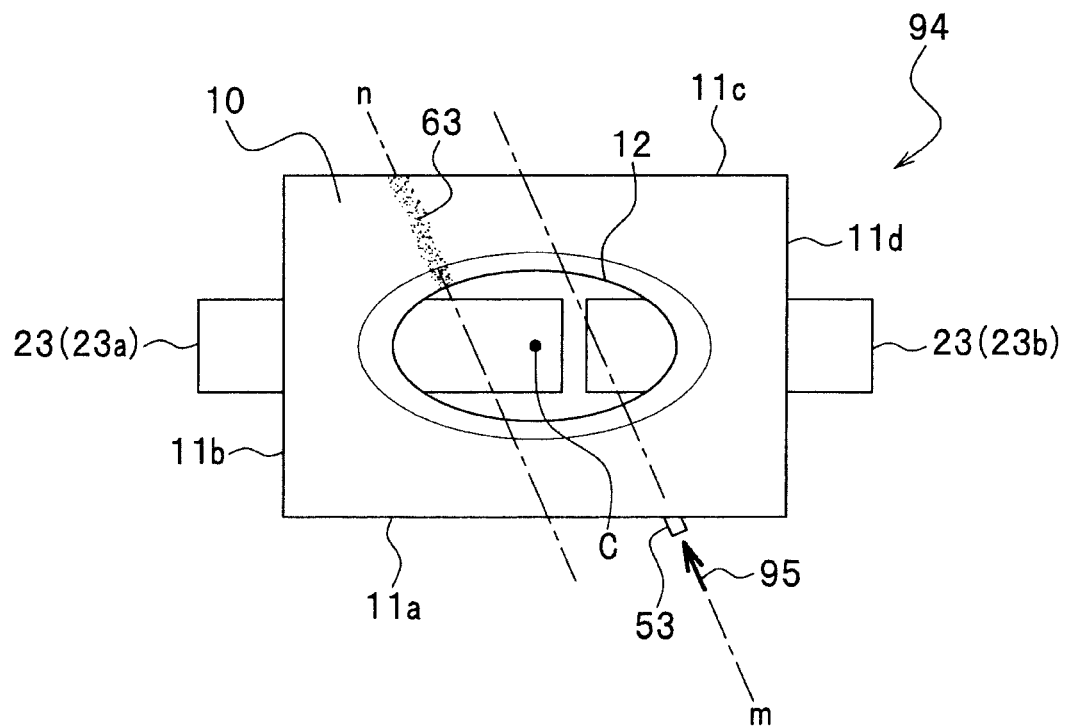
FIG. 9 is a plan view showing a third modified example of a package of the present invention.
Figure 10:
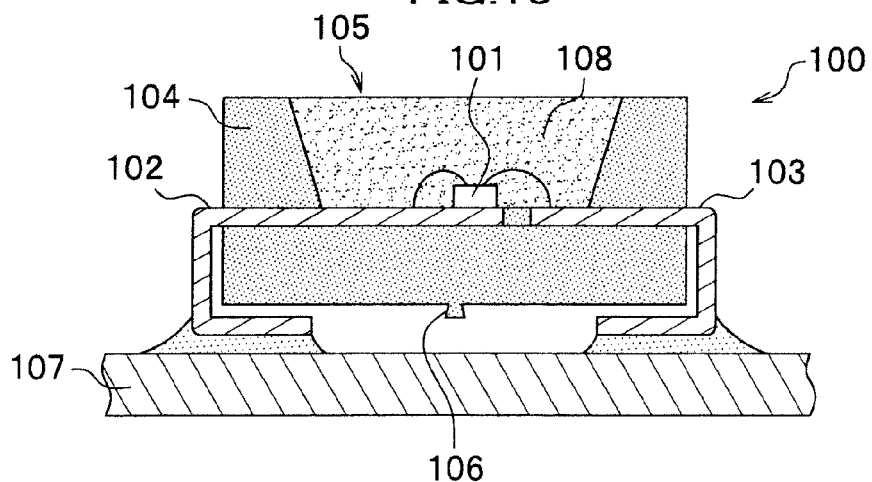
FIG. 10 is a side cross sectional view showing a conventional light emitting device of the Japanese Patent Laid-open Publication No. 2005-259972 or the Japanese Patent Laid-open Publication No. 2001-177160.
Figure 11:
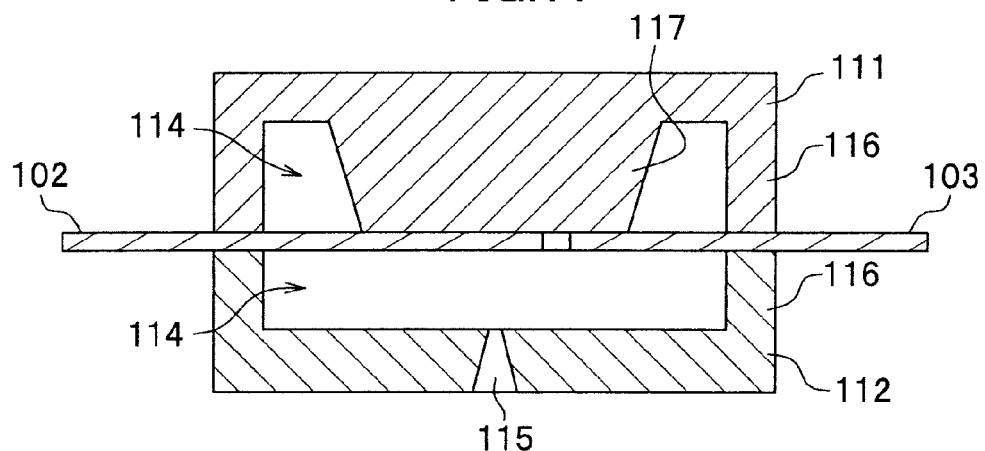
FIG. 11 is a side cross sectional view showing a method for molding a conventional resin mold body.
Figure 12:
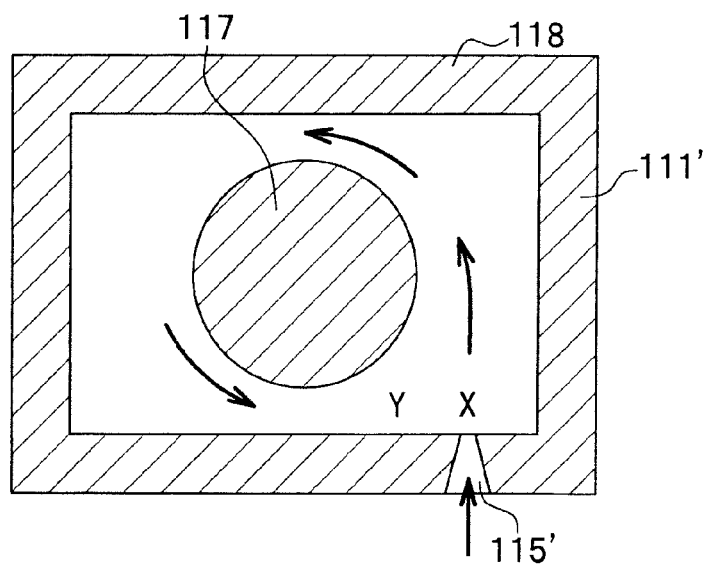
FIG. 12 is an illustration showing one embodiment of a conventional method, and which is a plan cross sectional view of an upper die.

FIG. 9 is a plan view showing a third modified example of a package according to the present invention.

As shown in FIG. 9, a package 94 of the third modified example is different from that of the first modified example in that a normal line m of a gate remain 53 and a normal line n of a weld line 63 are not on the same line. Namely, the package 94 includes the first resin mold body 10, which has a square shape in plan view, having the first external side surface 11a, the second external side surface 11b, the third external side surface 11c, and the fourth external side surface 11d, a first lead frame 23a disposed on the second external side surface 11b, and a second lead frame 23b disposed on the fourth external side surface 11d. In addition, the first resin mold body 10 is provided with the concave portion 12 having an ellipsoidal shape, and a gate remain 53 is formed on an extended line of a normal line m of the concave portion 12 toward a normal line direction. In addition, the weld line 63 is formed on an opposite side of the gate remain 53 across the center C of the concave portion 12.

Namely, in the package 94, the weld line 63 is formed at substantially a point-symmetric position of the gate remain 53 with respect to the center of the concave portion 12. As described above, even if the first thermosetting resin is injected obliquely against the first external side surface 11a See arrow 95), the first thermosetting resin flows in a direction of the normal line m of the concave portion 12, hits against a protruding portion (not shown), which forms the concave portion 12, of an upper die to split, and intermingles at a position of the weld line 63. In this case, the normal line n of the weld line 63 and the normal line m of the gate remain 53 are formed in parallel. Therefore, each of the split flows of the first thermosetting resin joins together and intermingles with each other to cause a sufficient curing reaction. As a result, a strong weld line 63 can be formed.

I claim:

1. A manufacturing method for manufacturing a light emitting device comprising a light emitting element; a first resin mold body having an external side surface and provided with a concave portion having a circular shape or ellipsoidal shape in plan view at a center of the first resin mold body; a plurality of lead frames arranged on a bottom surface of the concave portion and electrically connected to the light emitting element; and a second resin mold body made of a second thermosetting resin filled in the concave portion, wherein the light emitting element is placed on the lead frame and a surface of the second resin mold serves as a light emitting surface, the manufacturing method comprising steps of:
    a first process for sandwiching the lead frames by an upper die, which is provided with a protruding portion to be contacted with the lead frames and used for forming the concave portion, and a lower die paired with the upper die;
    a second process for injecting a first thermosetting resin into a space formed by the upper die and the lower die toward a normal line direction of a circular cross section or ellipsoidal cross section of the protruding portion;
    a third process for heating up the injected first thermosetting resin for curing;
    a fourth process for releasing the upper die;
    a fifth process for cutting off a gate formed in the injection port portion;
    a sixth process for placing the light emitting element on the lead frame to be arranged on a bottom surface of the concave portion and electrically connecting the light emitting element and the lead frame;
    a seventh process for filling a second thermosetting resin in the concave portion; and
    an eighth process for heating up the second thermosetting resin for curing.

2. The manufacturing method for manufacturing a light emitting device according to claim 1,
    wherein the first thermosetting resin is a resin comprising triazine derivative epoxy resin.

3. A manufacturing method for manufacturing a package comprising a first resin mold body having an external side surface and provided with a concave portion having a circular shape or ellipsoidal shape in plan view at a center of the first resin mold body and a plurality of lead frames arranged on a bottom surface of the concave portion, the manufacturing method comprising steps of:
    a first process for sandwiching the lead frames by un upper die, which is provided with a protruding portion to be contacted with the lead frames and used for forming the concave portion, and a lower die paired with the upper die;
    a second process for injecting a first thermosetting resin into a space formed by the upper die and the lower die toward a normal line direction of a circular cross section or ellipsoidal cross section of the protruding portion;
    a third process for heating up the injected first thermosetting resin for curing;
    a fourth process for releasing the upper die; and
    a fifth process for cutting off a gate formed in the injection port portion.

4. The manufacturing method for manufacturing a package according to claim 3,
    wherein the first thermosetting resin is a resin comprising triazine derivative epoxy resin.

* * * * *